United States Patent [19]

Miyauchi et al.

[11] Patent Number: 4,792,962
[45] Date of Patent: Dec. 20, 1988

[54] A RING-SHAPED RESONATOR TYPE SEMICONDUCTOR LASER DEVICE

[75] Inventors: Nobuyuki Miyauchi, Tenri; Hiroshi Hayashi, Kyoto; Osamu Yamamoto; Saburo Yamamoto, both of Nara, all of Japan

[73] Assignee: Sharp Kabushiki Kaisha, Osaka, Japan

[21] Appl. No.: 910,529

[22] Filed: Sep. 23, 1986

[30] Foreign Application Priority Data

Sep. 28, 1985 [JP] Japan .................. 60-215781

[51] Int. Cl.$^4$ .............................................. H01S 3/19
[52] U.S. Cl. .................................... 372/94; 372/45; 372/50
[58] Field of Search ............... 372/50, 94, 44, 45, 372/46, 108

[56] References Cited

U.S. PATENT DOCUMENTS

| 3,760,297 | 9/1973 | Thompson | 372/94 |
| 4,002,997 | 1/1977 | Thompson | 372/50 |
| 4,112,389 | 9/1978 | Streifer et al. | 372/50 |

FOREIGN PATENT DOCUMENTS

| 1278037 | 9/1968 | Fed. Rep. of Germany . |
| 1295739 | 5/1969 | Fed. Rep. of Germany . |
| 2233296 | 5/1973 | Fed. Rep. of Germany . |
| 3131232 | 8/1981 | Fed. Rep. of Germany . |

OTHER PUBLICATIONS

W. Brunner und K. Munge: Lasertechnik, 1982, S. 210-212.
Jap. J. App. Phys., vol. 16 Nr. 8, 1977, S. 1395-1398, "AlGaAs-GaAs Semiconductor Ring Laser".
Higuchi et al., Laser Kenkyu, vol. 13, p. 156, 1985.
IEEE Journal of Quantum Electronics, vol. QE-20, No. 8, Aug. 1984.
Hirano, R., et al. Appl Phys Lett, 43(2), Jul. 15, 1983.
Japanese Journal of Applied Physics, vol. 16, No. 8, Aug. 1977.
Tsang, W. T., Appl Phys Lett, 39(10), Nov. 15, 1981.
Dutta, N. K., J Appl Phys, 53(11), Nov. 1982.
Iwamura, H., Electronics Letters, vol. 19, No. 5, Mar. 3, 1983.

Primary Examiner—James W. Davie
Attorney, Agent, or Firm—Ciotti & Murashige, Irell & Manella

[57] ABSTRACT

A semiconductor laser device comprising: a ring-shaped resonator constituted by a square-shaped optical waveguide composed of four straight optical waveguide sides in which facing sides are positioned in a parallel manner and a reflecting mirror is formed at each of the four corners of said square-shaped optical waveguide in a manner to divide the intersection angle of two each of said four sides at each of said four corners into two equal parts, and a means, for releasing laser light from said ring-shaped resonator, which is disposed on or near a part or the whole area of at least one of said four sides of said square-shaped optical waveguide.

6 Claims, 3 Drawing Sheets

A RING-SHAPED RESONATOR TYPE SEMICONDUCTOR LASER DEVICE

BACKGROUND OF THE INVENTION

1. Field of the Invention

This invention relates to a ring-shaped resonator type semiconductor laser device.

2. Description of the Prior Art

Semiconductor laser devices are laser oscillators which are composed of a Fabry-Pérot resonator which contains therein an active region functioning as an optical waveguide positioned between the reflecting mirros (i.e., the cleaved facets), and which attain laser oscillation by the cleaved facets. These laser oscillators are advantageous in that the reflecting mirrors can be readily and formed in a parallel manner by the cleavage of growth crystals and that mass-production thereof can be attained since a plurality of device units can be produced by the epitaxial growth of crystal layers on a single semiconductor substrate. However, they are inferior in that light is transmitted through the reflecting mirrors, which causes a limitation of the lowering of the threshold current level. The lowering of the threshold current level is a most important issue not only to improve reliability of semiconductor laser devices, but also to advance optical integrated-circuit technology. For these purposes, an AlGaAs ring-shaped semiconductor has been developed and reported in the Japanese Journal of Applied Physics, vol. 16, No. 8, pp. 1395-1398, August, 1977. However, this ring-shaped semiconductor laser device is designed so that the mesa waveguide is formed in a circular shape by an etching technique, so that light-emission loss at the curved portion of the waveguide and light-scattering loss at the etched rough surface of the waveguide arise, which causes difficulties in obtaining a stable light output versus current characteristics. Moreover, the ring-shaped semiconductor laser device is inferior in that it is not provided with an optical coupling means by which laser light is released from the resonator. Thus, this conventional ring-shaped semiconductor laser device has not been put to practical use.

SUMMARY OF THE INVENTION

The semiconductor laser device of this invention, which overcomes the above-discussed and numerous other disadvantages and deficiencies of the prior art, comprises a ring-shaped resonator constituted by a square-shaped optical waveguide composed of four straight optical waveguide sides in which facing sides are positioned in a parallel manner and a reflecting mirror is formed at each of the four corners of said square-shaped optical waveguide in a manner to divide the intersection angle of two each of said four sides at each of said four corners into two equal parts, and a means, for releasing laser light from said ring-shaped resonator, which is disposed on or near a part or the whole area of at least one of said four sides of said square-shaped optical waveguide.

The means for releasing laser light from said ring-shaped resonator is, in a preferred embodiment, a curved optical waveguide positioned in the vicinity of at least one of said four sides of said square-shaped optical waveguide.

Thus, the invention described herein makes possible the objects of (1) providing a ring-shaped resonator type semiconductor laser device which can attain a reduction of light-emission loss and light-scattering loss from the optical waveguides; (2) providing a ring-shaped resonator type semiconductor laser device which can attain laser oscillation at a significantly low threshold current level; and (3) providing a ring-shaped resonator type semiconductor laser device which can be easily reproduced.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

The semiconductor laser device of this invention comprises a ring-shaped resonator which is constituted by a square-shaped optical waveguide composed of four straight optical waveguide sides in which facing sides are positioned in a parallel manner. Two each of the four sides intersect at each of the four corners of the square-shaped optical waveguide. A reflecting mirror is formed at each of the four corners of the square-shaped optical waveguide in a manner to divide the intersection angle of two each of the four sides at said four corners into two equal parts. This semiconductor laser device further comprises a means for releasing laser light from said ring-shaped resonator. Said means is disposed on or near a part or the whole area of at least one of the four sides.

EXAMPLE

Figure 1:
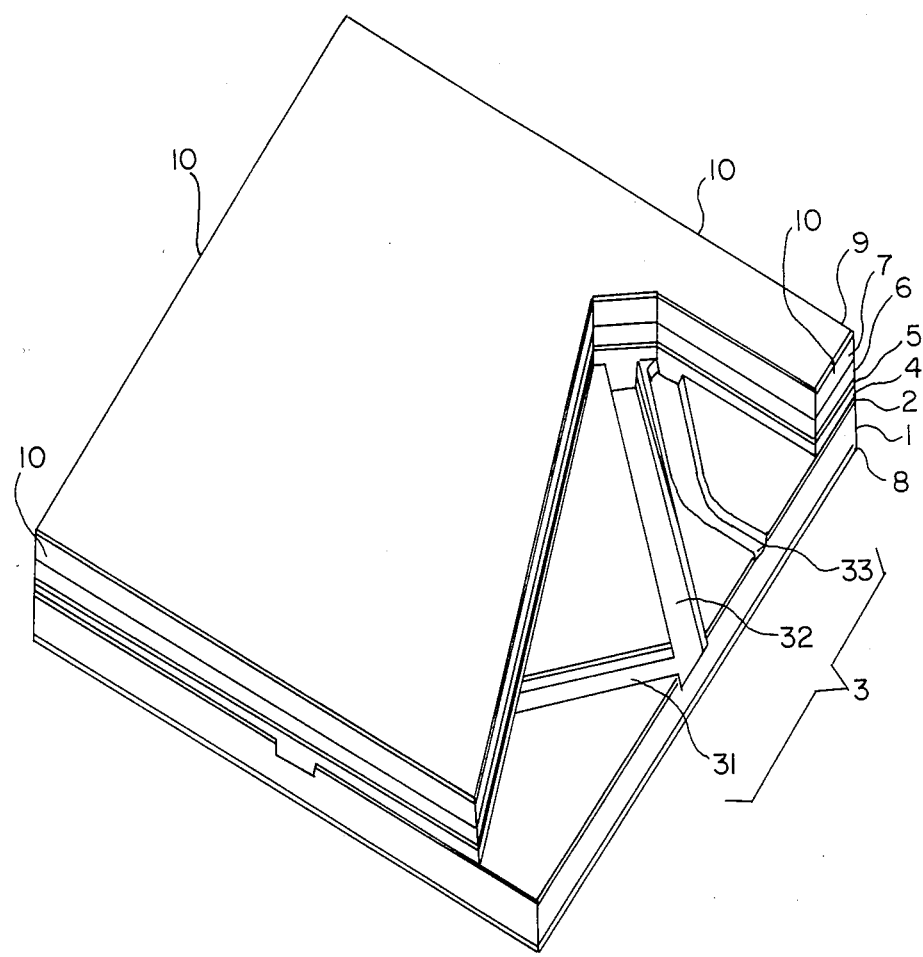
FIG. 1 is a perspective notched view showing a ring-shaped resonator type semiconductor laser device of this invention.
Figure 2:
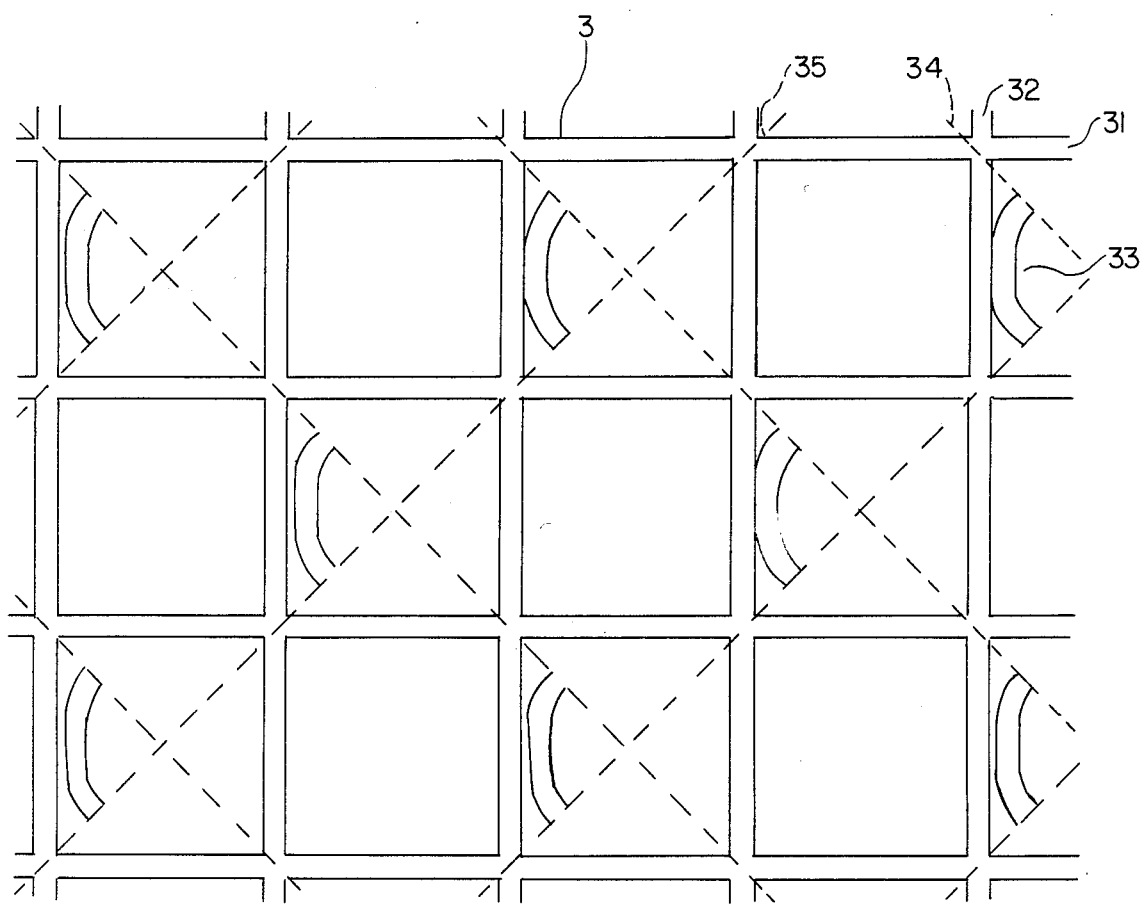
FIG. 2 is a plane view showing a channel pattern formed in the substrate of the semiconductor laser device shown in FIG. 1.

FIG. 1 shows a semiconductor laser device of this invention, which is produced as follows: On the (100) plane of a p-GaAs substrate 1, an n-GaAs current blocking layer 2 having a thickness of about 0.8 μm is grown by a crystal growth technique such as liquid phase epitaxy. Then, a striped channel 3 is formed into the substrate 1 through the current blocking layer 2 by a wet or dry etching technique, resulting in an electroconductive region. As shown in FIG. 2, the striped channel 3 forms a lattice composed of straight channel parts 31 with a spaced pitch positioned in the <001> direction and straight channel parts 32 with a spaced pitch positioned in the <010> direction which is at right angles to the <001> direction. The dashed lines 34 and 35 in the diagonal direction in FIG. 2 represent the directions of the (0$\bar{1}$1) planes and the (011) planes at which cleavage is carried out in the succeeding process to form the facets. Each of the square areas surrounded with the dashed lines 34 and 35 finally constitutes one semiconductor laser device unit. If the striped channel 3 is composed of the straight channel parts 31 and 32 only, laser light cannot be released from the optical waveguide constituting a ring-shaped resonator which is formed within the active layer corresponding to the channel parts 31 and 32. In order for laser light to be emitted from the facets, the striped channel 3 must contain a curved channel part 33 by which another optical waveguide is formed within the active layer. The channel part 33 is curved in the vicinity of the facets to intersect the adjacent facets at a right angle of both ends.

Then, on the current blocking layer 2 containing the channel 3, a p-GaAlAs first cladding layer 4, a p-GaAlAs active layer 5, an n-GaAlAs second cladding layer 6, and an n-GaAs cap layer 7 are successively grown by liquid phase epitaxy, resulting in a double-heterostructure multi-layered crystal for laser oscillation. The resonator of this laser device is formed in the same manner as the resonator based on the optical waveguide of a VSIS (V-channeled substrate inner stripe) laser having current confining channels therein. Then, on the back face of the p-substrate 1 and the upper face of the n-cap layer 7, a p-sided electrode 8 and an n-sided electrode 9 are formed by vapor deposition, respectively. The resulting wafer is then cleaved along the dashed lines 34 and 35 shown in FIG. 2, resulting in semiconductor laser device units, each of which is surrounded with four facets 10 (FIG. 1).

Figure 3:
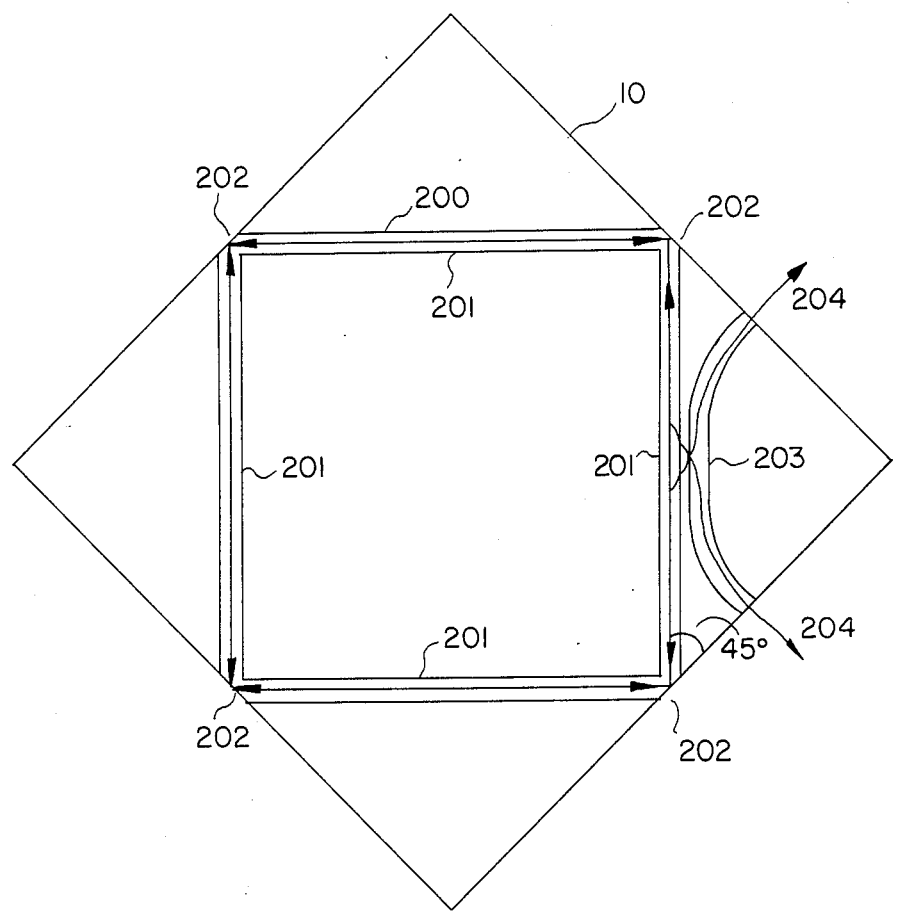
FIG. 3 is a diagram showing the laser light propagation in the semiconductor laser device shown in FIG. 1.

FIG. 3 shows laser light propagation in the above-mentioned semiconductor laser device. The distribution of refractive indexes corresponding to the channel parts 31, 32 and 33 is created in the active layer 5, resulting in optical waveguides 200 and 203 within the active layer 5. The optical waveguide 200 is of a square-shape which is formed corresponding to the straight channel parts 31 and 32. Each of the four corners of the square-shaped optical waveguide 200 is positioned at the reflecting mirror 202 in the facet 10 and each side 201 of the square-shaped waveguide 200 intersects the facet 10 at an angle of 45°, resulting in a ring-shaped resonator. Since the refractive index of the GaAlAs layer 5 is 3.6 when the Al composition ratio of the GaAlAs mixed crystal is 0.08 (which corresponds to an oscillation wavelength of 820 nm), and moreover the refractive index of air is 1, laser light propagated in the ring-shaped resonator, which is constituted by the optical waveguide 200 intersecting the facets 10 at 45 degrees, undergo total reflection at the facets 10 (i.e., the reflecting mirrors 202).

The other optical waveguide 203 is curved, formed corresponding to the curved channel part 33. The curved optical waveguide 203 is positioned in the vicinity of one side 201 of the square-shaped optical waveguide 200 and intersects the facets 10 at 45 degrees at both ends, so that laser light propagated in the ring-shaped resonator are propagated in the curved optical waveguide 203, due to the optical coupling action between the side 201 of the square-shaped optical waveguide 200 and the curved optical waveguide 203, and they are released from the adjacent facets 10 as laser lights 204.

When DC current was injected into this semiconductor laser device through the electrodes 8 and 9, the laser device attained laser oscillation in a single longitudinal mode with an external differential quantum efficiency of 0.4 (mW/mA) and an oscillation wavelength of 825 nm at a low threshold current of 30 mA. These operation characteristic data were obtained under conditions which have not yet been optimized, and will be improved by an optimization in the crystal growth method, the device structure, etc.

This semiconductor laser device having the above-mentioned structure enables not only the improvement in operation characteristics but also the application to optical communication, information processing, etc., without using complicated modulators, optical parts, etc. Laser lights are propagated in the opposite direction in the ring-shaped resonator and independently released from the facets through the curved optical waveguide, so that a ring-shaped laser gyro can be obtained from this laser device. Moreover, when this laser device is designed to electrically isolate the ring-shaped resonator from the curved optical waveguide by the separation of the electrode into two parts, the emission of laser light from the facets can be controlled, resulting in a Q switched laser. Moreover, although this laser device is provided with a single curved optical waveguide through which laser light is released from the ring-shaped resonator, when the curved optical waveguide is formed in the vicinity of each of the four sides of the square-shaped optical waveguide constituting the ring-shaped resonator, eight laser lights can be obtained from one laser device at the same time, which allows for the transmission of information to a plurality of locations at the same time.

Although the above-mentioned example discloses only a cleavage to form the four reflecting mirrors, any etching technique such as a chemical etching technique, a reactive ion etching technique or a reactive ion beam etching technique can be also employed. The above-mentioned example discloses the production of a double-heterostructure multi-layered crystal by liquid phase epitaxy to form the optical waveguides, but is not limited thereto. The optical waveguides can be also formed by vapor phase epitaxy. Moreover, a multi-quantum well structure can be formed by a thin crystal film growth technique such as molecular beam epitaxy, metal organic-chemical vapor deposition, etc., so as to reduce optical loss in the optical waveguides, thereby attaining laser oscillation at a low threshold current level.

The above-mentioned example discloses a structure in which the optical waveguide 203 is positioned adjacent to one side 201 of the optical waveguide 200 constituting the ring-shaped resonator so that laser light can be released from the ring-shaped resonator, but is not limited thereto. A diffraction grating can be formed in a part or the whole area of the optical waveguides or an acoustic optical modulator can be incorporated into this laser device, so that a light deflection function or a wavelength selecting function can be achieved, allowing laser light to be released from the ring-shaped resonator.

Although a GaAs-GaAlAs semiconductor laser device along is described in the above-mentioned example, other semiconductor materials can be, of course, applicable to this invention.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device comprising a ring-shaped resonator,
    said ring-shaped resonator is constituted by a square-shaped optical waveguide composed of four straight optical waveguide sides in which facing sides are positioned in a parallel manner and a reflecting mirror is formed at each of the four corners of said square-shaped optical waveguide in a manner to divide the intersection angle of two each of said four sides at each of said four corners into two equal parts, and a means for releasing laser light from said ring-shaped resonator is disposed near a part of at least one of said four sides of said square-shaped optical waveguides, at least one portion of said means being optically coupled with at least one of said four sides of said square-shaped optical waveguides.

2. A semiconductor laser device according to claim 1, wherein said means for releasing laser light from said ring-shaped resonator is a curved optical waveguide at least one portion of which elonages along at least one of said four sides of said square-shaped optical waveguides.

3. A semiconductor laser device according to claim 1, wherein said reflecting mirror is formed by one of the facets of the semiconductor laser device.

4. In a semiconductor laser device comprising a ring-shaped resonator, said ring-shaped resonator is constituted by a square-shaped optical waveguide composed of four straight optical waveguide sides in which facing sides are positioned in a parallel manner and a reflecting mirror is formed at each of the four corners of said square-shaped optical waveguides, and a means for releasing laser light from said ring-shaped resonator is disposed near a part of at least one of said four sides of said square-shaped optical waveguides; at least one portion of said means being optically coupled with at least one of said four sides of said square-shaped optical waveguides.

5. A semiconductor laser device according to claim 4, wherein said means for releasing laser light from said ring-shaped resonator is a curved optical waveguide, at least one portion of which elongates along at least one of said four sides of said square-shaped optical waveguides.

6. A semiconductor laser device according to claim 4, wherein said reflecting mirror is formed by one of the facets of the semiconductor laser device.

* * * * *